US008298945B2

(12) United States Patent
Leung et al.

(10) Patent No.: US 8,298,945 B2
(45) Date of Patent: Oct. 30, 2012

(54) METHOD OF MANUFACTURING SUBSTRATES HAVING ASYMMETRIC BUILDUP LAYERS

(75) Inventors: Andrew Leung, Markham (CA); Roden R. Topacio, Markham (CA); Liane Martinez, New Market (CA); Yip Seng Low, Thornhill (CA)

(73) Assignee: ATI Technologies ULC, Markham, Ontario (CA)

(*) Notice: Subject to any disclaimer, the term of this patent is extended or adjusted under 35 U.S.C. 154(b) by 0 days.

(21) Appl. No.: 13/152,918

(22) Filed: Jun. 3, 2011

(65) Prior Publication Data
US 2011/0225813 A1 Sep. 22, 2011

Related U.S. Application Data

(62) Division of application No. 12/533,569, filed on Jul. 31, 2009, now abandoned.

(51) Int. Cl.
*H01L 21/44* (2006.01)
(52) U.S. Cl. .................. 438/667; 438/622; 257/E21.597
(58) Field of Classification Search .......... 438/666–668, 438/622; 257/E21.597
See application file for complete search history.

(56) References Cited

U.S. PATENT DOCUMENTS

| 6,455,783 B1* | 9/2002 | Tsukada et al. ............... 174/256 |
| 2006/0231943 A1 | 10/2006 | Chiu et al. |
| 2006/0289203 A1 | 12/2006 | Oda |

FOREIGN PATENT DOCUMENTS
WO 00/79849 A1 12/2000

OTHER PUBLICATIONS

International Search Report mailed Nov. 4, 2010 in relation to PCT Application No. PCT/CA2010/001174 filed Jul. 28, 2010.
Written Opinion mailed Nov. 4, 2010 in relation to PCT Application No. PCT/CA2010/001174 filed Jul. 28, 2010.
Pham, Thanhha S., USPTO Communication, mailed Feb. 3, 2011, in related U.S. Appl. No. 12/533,269, filed Jul. 31, 2009.

* cited by examiner

*Primary Examiner* — Thanhha Pham
(74) *Attorney, Agent, or Firm* — Faegre Baker Daniels LLP

(57) ABSTRACT

A method of manufacturing a substrate for use in electronic packaging having a core, m buildup layers on a first surface of the core and n buildup layers on a second surface of the core, where m≠n is disclosed. The method includes forming (m−n) of the m buildup layers on the first surface, and then forming n pairs of buildup layers, with each one of the pairs including one of the n buildup layers formed on the second surface and one of the remaining n of the m buildup layers formed on the first surface. Each buildup layer includes a dielectric layer and a conductive layer formed thereon. The disclosed method protects the dielectric layer in each of buildup layers from becoming overdesmeared during substrate manufacturing by avoiding repeated desmearing of dielectric materials.

14 Claims, 3 Drawing Sheets

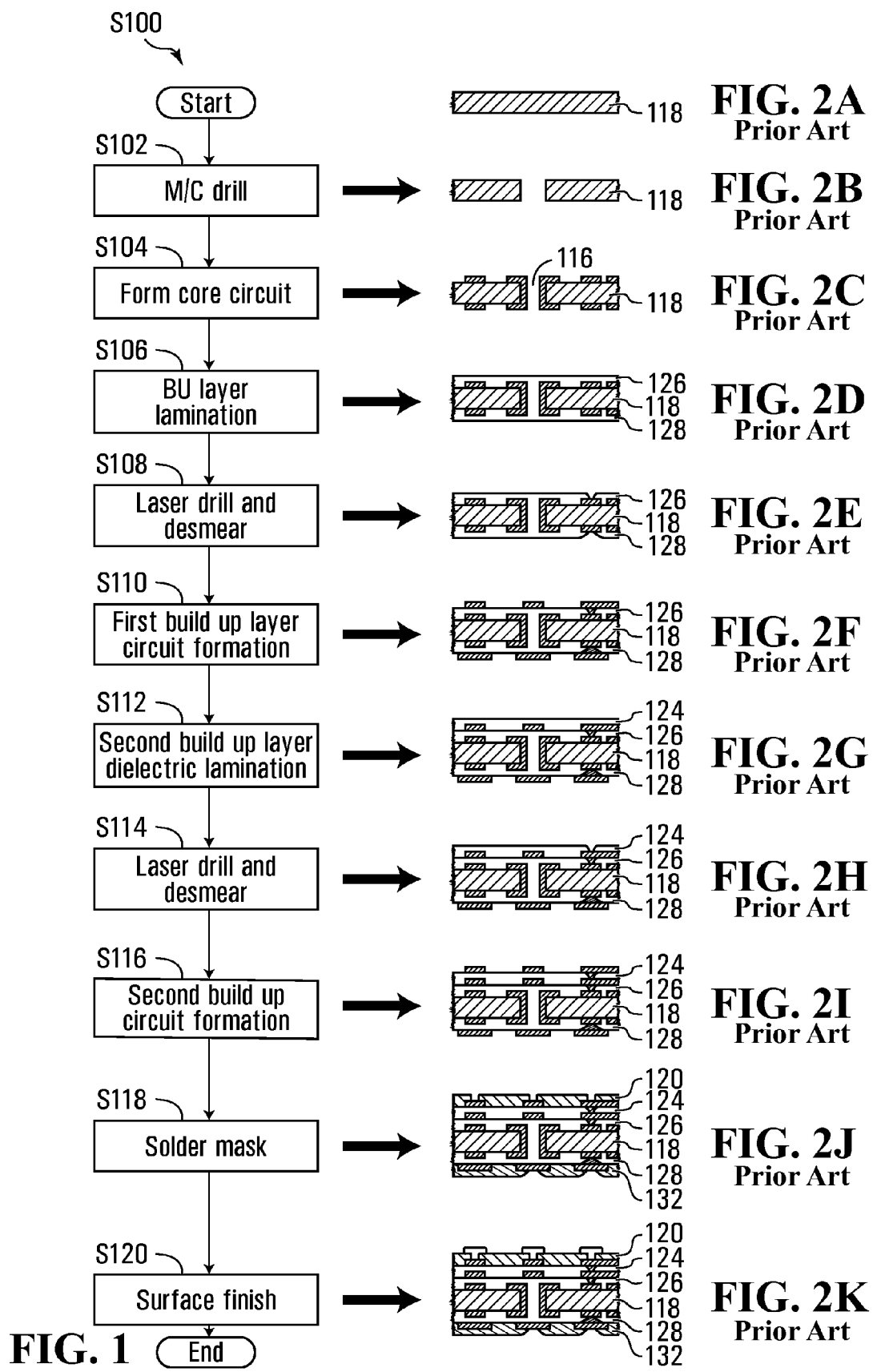

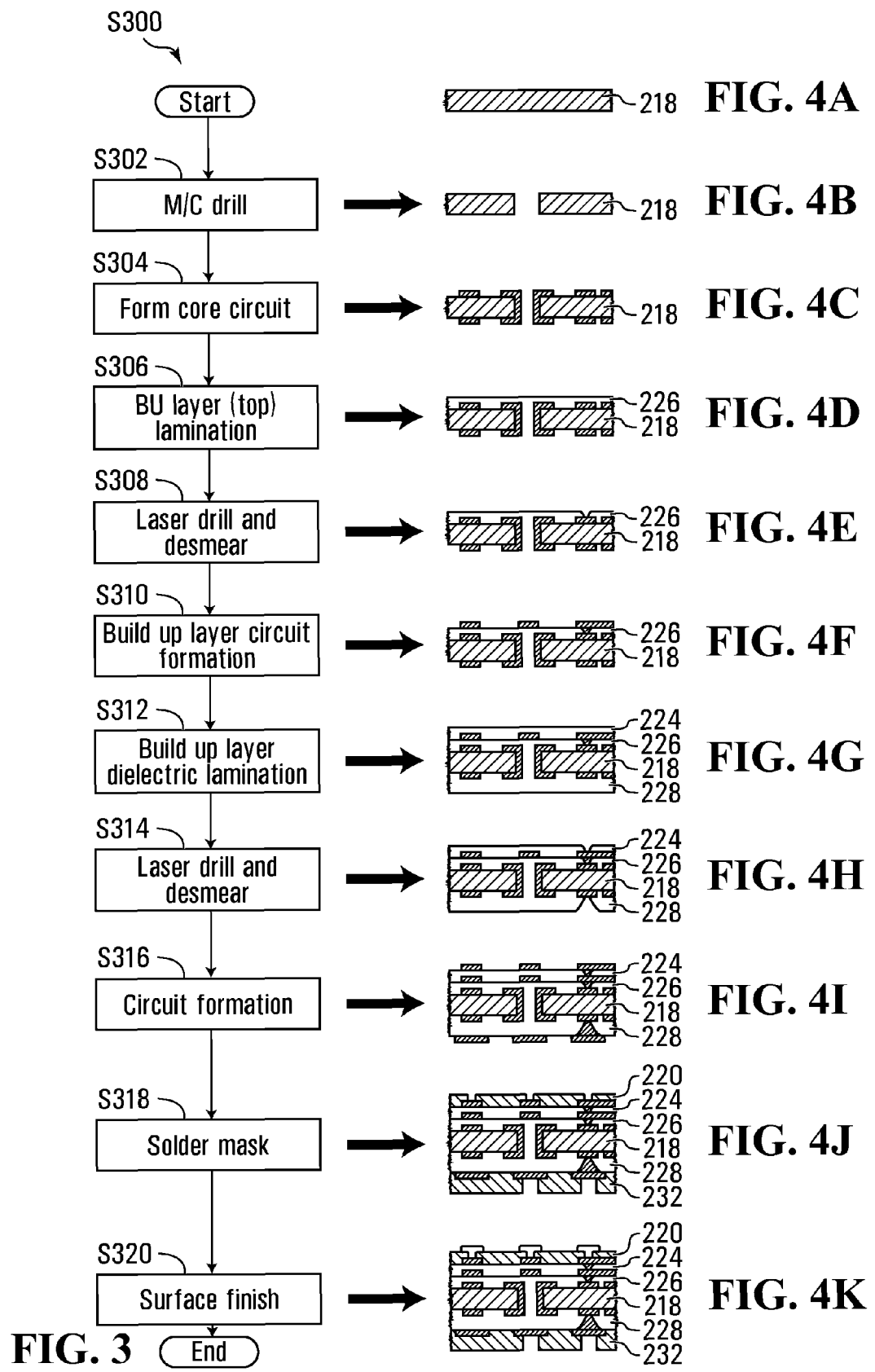

ment of the present invention, used to make an exemplary
METHOD OF MANUFACTURING SUBSTRATES HAVING ASYMMETRIC BUILDUP LAYERS

CROSS-REFERENCE TO RELATED APPLICATIONS

This application is a divisional of U.S. patent application Ser. No. 12/533,569 filed Jul. 31, 2009, the contents of which are hereby incorporated herein by reference.

FIELD OF THE INVENTION

The present invention relates generally to electronic packaging, and more particularly to substrates for use in such packaging, having an unequal number of buildup layers on opposite sides, that may form part of integrated circuit packages, peripheral expansion cards and printed wiring boards or printed circuit boards.

BACKGROUND OF THE INVENTION

Substrates are used in integrated circuit packages, peripheral expansion cards, motherboards and other printed wiring boards that are used to form electronic circuit packages. Conductive traces formed on the substrate electrically interconnect various electrical components that are attached to the substrate.

Integrated circuit packages, for example, usually include a carrier substrate used to attach a semiconductor die containing an integrated circuit. The carrier substrate may also contain solder balls or pins which are used to attach the integrated circuit package to an external circuit such as a peripheral expansion card or a printed circuit board.

A substrate usually includes a core on which one or more routing layers for routing electrical signals are formed. Typically, a passive circuit of conductive traces is initially formed on one or both surfaces of the core. These conductive traces are often etched using thin-film metals or copper foils. Thereafter, one or more additional routing layers are built upon the core (so called "buildup layers"). A buildup layer typically includes a dielectric layer and a conductive layer. The dielectric layer is typically formed by laminating dielectric material over a formed routing layer or the core. The conductive layer is formed on the dielectric layer. The dielectric material in the buildup layer insulates the conductive layer, from conductive traces underneath the dielectric layer. Holes may be formed at suitable points in the dielectric layer to interconnect parts of the conductive layer on the dielectric of one buildup layer, to traces underneath the dielectric material. Multiple such buildup layers can be formed on one another.

Typically, an equal number of buildup layers are formed on each side (top and bottom sides) of the core. Conductive tunnels or perforations through the core, called plated through-holes (PTH), are often used to interconnect traces on the top buildup layers to traces at the bottom buildup layers of the substrate core.

Forming an equal number of buildup layers on each side of the core is often inefficient as it may lead to the formation of more buildup layers than may be required. For example, if an odd number of buildup layers (e.g., three layers) are sufficient, then having an equal number of buildup layers on top and at the bottom of the core (e.g., two on each side) introduces a fourth, largely redundant layer. This is undesirable as it adds to the material and manufacturing cost of the package.

Known methods for reducing the number of buildup layers include using coreless substrates. However, this increases the risk of warping and thus often requires the use of stiffeners which unfortunately increases manufacturing costs.

Single-sided substrates, that have buildup layers formed only on one side, are also known. However, such substrates are also susceptible to warping. Moreover, in a single-sided substrate, electric components, such as an integrated circuit die, are typically attached to the same side of the substrate (containing the buildup layers) which limits the area available to attach the die.

Although it is also known to manufacture substrates having an unequal number of buildup layers of each side of a core, known methods often lead to undesirable properties such as over-desmearing of the dielectric layer in some of the buildup layers, and warping.

Accordingly, there is a need for integrated circuit packages that make efficient use of buildup layers, while avoiding the aforementioned disadvantages.

SUMMARY OF THE INVENTION

A method of manufacturing a substrate with asymmetric buildup layers is disclosed. The substrate has a core, m buildup layers formed on one surface of the core and n buildup layers (m>n) formed on the opposite surface of the core.

In accordance with one aspect of the present invention, there is provided a method of manufacturing a substrate having a core, m buildup layers on a first surface of the core and n buildup layers on a second surface of the core, where m>n. Each of the buildup layers comprises a dielectric layer, and a conductive layer formed thereon. The method includes: forming (m−n) of the m buildup layers on the first surface. Forming each of the (m−n) of the m buildup layers includes drilling and desmearing a respective dielectric layer; and forming n pairs of buildup layers, each of the n pairs having one of the n buildup layers formed on the second surface and one of the remaining n of the m buildup layers formed on the first surface. Forming each of the n pairs of buildup layers includes drilling each one of a respective pair of dielectric layers, and desmearing the respective pair of dielectric layers concurrently.

Other aspects and features of the present invention will become apparent to those of ordinary skill in the art upon review of the following description of specific embodiments of the invention in conjunction with the accompanying figures.

BRIEF DESCRIPTION OF THE DRAWINGS

In the figures which illustrate by way of example only, embodiments of the present invention, FIG. 1 is a flowchart of a conventional process used to manufacture a conventional substrate having an unequal number of buildup layers on either sides of the core;

FIGS. 2A-2K are vertical cross-sectional views of a conventional substrate at different stages of manufacturing corresponding to the steps depicted FIG. 1;

FIG. 3 is a flowchart of a process, exemplary of an embodiment of the present invention, used to make an exemplary substrate;

FIGS. 4A-4K are vertical cross-sectional views of an exemplary substrate at different stages of manufacturing corresponding to the exemplary steps depicted in FIG. 3;

DETAILED DESCRIPTION

Figure 5:
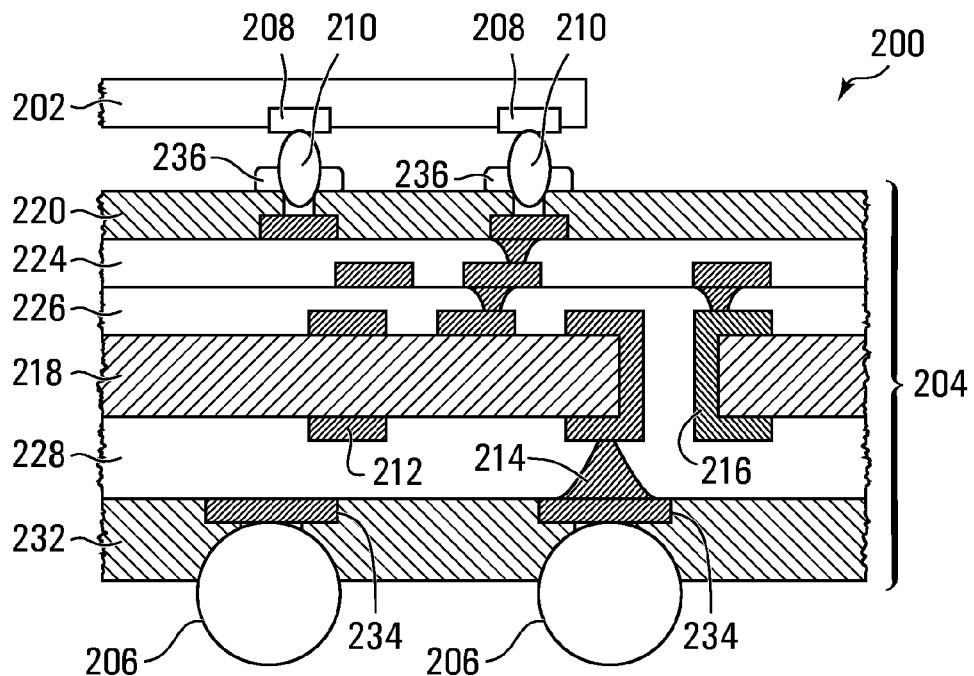
FIG. 5 is a vertical cross-sectional view of an exemplary semiconductor device having an unequal number of buildup layers on each side of a substrate core.

Substrates that include a core having k layers, m buildup layers on one side of the core, and n buildup layers on the other side of the core, may generally be said to have an m/k/n buildup design, where m and n are positive integers. Such substrates may be said to have asymmetric buildup layers if m≠n.

Asymmetric substrates that have m/k/n buildup design thus include a core and a total of m+n buildup layers. Each buildup layer typically includes a dielectric layer such as Ajinomoto build-up film (ABF) for example, and conductive traces formed on the dielectric layer.

Flowchart S100 in FIG. 1 depicts a conventional manufacturing process often used by substrate vendors to provide substrates having asymmetric or unequal numbers of buildup layers on opposite sides of a core. FIGS. 2A-2K depicts cross-sectional views of such a substrate at different stages concordant with the steps in flowchart S100.

As shown, a substrate core 118 which may have its own sub-layers is initially machine drilled in step S102 to form a plated through-hole (PTH). In step S104 conductive traces are used to form a circuit or conductive layer on either side of core 118. A plated through hole 116 may be used to interconnect circuit traces on opposite sides of substrate core 118. In step S106, a first top buildup layer 126 and a first bottom buildup layer 128 are laminated using a dielectric material (e.g. ABF). In step S108, the first buildup dielectric layers 126, 128 (top and bottom) are laser drilled, and desmeared to expose traces of the core circuit formed in step S104. In step S110 conductive traces are used to form conductive layers on both first top buildup layer 126 and on first bottom buildup layer 128.

Desmearing generally refers to the removal of residues, to ensure proper electrical interconnections. Residues may include smeared epoxy-resin byproducts, ABF bits or dielectric bits may attach to trace surfaces that are exposed within a drilled hole (via, micro-via or PTH). For example, during drilling, dielectric materials such as epoxy-resin or ABF, often melt and become smeared across surfaces of conductive traces. Subsequent plating of drilled holes (vias or through-holes) using conductive material is intended to electrically connect traces from different buildup layers. Thus, unless removed, the residue would create a dielectric barrier between trace surfaces and the conductive plating of the inner walls of drilled holes, often leading to a defective circuit. Desmearing typically involves the use of a cleaning solution such as sodium or potassium permanganate to chemically clean and remove such residue from conductive traces.

In step S112, the dielectric layer of a second buildup layer 124 is formed using an ABF layer or equivalent dielectric material. However, no additional (second) bottom buildup layer is formed, as it is not required. In step S114, the top second buildup layer 124 is laser drilled and desmeared to expose the traces of the conductive layer of the first buildup layer formed in step S110.

Where holes are drilled, residues of the drilled material are formed. For example, when a dielectric layer such as epoxy fiber glass or resin is drilled, pieces of the dielectric material may be formed. During mechanical drilling, friction of the drill bit against the material being drilled causes the temperature of the drill bit to rise above the melting temperature of the material. Laser drilling similarly raises the temperature above the melting point of the material being drilled. Pieces of the drilled material thus melted are often smeared onto surfaces such as the inner walls of the hole which expose parts of conductive traces.

Desmearing is thus required to remove the residue (left by drilling in step S114), some of which may have been smeared on the conductive traces. Desmearing typically involves several immersions or dipping of the substrate in a cleaning solution such as a permanganate solution, for a predetermined duration. Desmearing is known in the art and is described, for example, in U.S. Pat. No. 4,425,380 and U.S. Pat. No. 4,601,783 the contents of which are incorporated herein by reference. Moreover, desmearing may also involve a water rinse after immersing the substrate in a chemical solution.

Immersing the substrate in a chemical solution affects exposed buildup layers. As such, in step S114 first bottom buildup layer 128 is also desmeared. Notably, this is the second desmearing step performed on layer 128 as it was already desmeared in step S108 and may thus be unnecessary.

In step S116, additional conductive traces are used to form the conductive layer of second top buildup layer 124 and the conductive layer of bottom buildup layer 128.

In step S118, solder masks 120 and 132 are applied to the conductive layer formed on buildup layers 124, 128 respectively. In step S120, surface finishing is performed to provide additional protection against oxidation of the conductive layer, and to prepare the surface for mounting solder balls and/or attaching a die.

The resulting substrate depicted in FIG. 2K has a 2/k/1 buildup design where k is the number of sub-layers in core 118. Unfortunately however, the substrate of FIG. 2K may include an overdesmeared bottom buildup layer 128 as a consequence of two desmearing steps (S108 and S114).

Over-desmearing results from subjecting a dielectric layer to multiple desmearing steps. For example, in FIG. 1, the dielectric layer of buildup layer 128 is desmeared twice in S100 (once in step S108 and then again in step S114). Over-desmearing leads to many undesirable changes in a buildup layer. For example, the adhesion properties a dielectric layer may be negatively affected. In addition, drilled holes or vias in the dielectric layer may expand, if multiple desmearing steps are applied. Moreover, the surface of dielectric layers may become rougher as a result.

Accordingly, FIG. 3 depicts a flowchart S300 depicting a manufacturing process exemplary of an embodiment of the present invention, which may be used to provide a substrate device having different (unequal) numbers of buildup layers on opposite sides of its core. The first surface (e.g., top) of the core may have m buildup layers formed thereon while the second (e.g., bottom) surface may have n buildup layers formed (where m≠n). FIGS. 4A-4K depict sectional views of the substrate being manufactured, at different stages manufacturing concordant with the steps depicted in flowchart S300.

As illustrated in FIG. 3, a substrate core (e.g., core 218) which may have its own sub-layers (sub-layers not shown), is initially machine drilled in step S302.

In step S304 conductive traces are used to form a conductive layer or circuit on either side of core 218. Conductive layers may be formed by etching conductive traces on the core using thin-film metal or copper foils. A plated through hole (PTH) 216 may be formed and used to interconnect the core circuit traces on opposite sides of substrate core 218. PTH is formed by plating the inner walls of the hole formed in step S302, with conductive material, such as copper.

In step S306, the dielectric layer of a first top buildup layer 226 is formed by laminating a dielectric material such as ABF. However, at this step, no bottom buildup layer is formed. Instead only the top buildup layer is formed. It should be noted that this contrasts with the conventional process depicted in flowcharts S100, in which both the first top and the first bottom buildup layers would have been formed at this stage.

In step S308, first buildup layer 226 is laser drilled, and desmeared to expose circuit traces formed in step S304 on the upper side of core 218. The circuit on the lower side of core 218 is already exposed, as there is no lamination of the bottom.

In step S310 conductive traces are used to form a conductive layer or circuit on buildup layer 226. Notably, at the bottom of the substrate resides the circuit formed on the lower surface of core 218.

As will become apparent, in general, for m top buildup layers and n bottom buildup layers (where m>n), steps S306, S308, S310 may be sequentially performed to form a dielectric layer, drill and desmear the dielectric layer, and then form a conductive layer on the desmeared dielectric, in order to form (m−n) of the top m buildup layers.

In step S312, a second top buildup layer 224 and a first bottom buildup layer 228 are formed using a layer of dielectric material such as ABF. As will be detailed below, layer 228 may be substantially thicker than layer 224 to help mitigate warping.

In step S314, the dielectric layers of second top buildup layer 224 and first bottom buildup layer 228 may be laser drilled and then desmeared. The drilled vias expose parts of the circuit traces of the conductive layer atop top buildup layer 226 (formed in step S310) and also expose parts of the circuit traces formed at the bottom of substrate core 218 (formed in step S304).

In step S316, additional conductive traces are used to form conductive layers of both second top buildup layer 224 and first bottom buildup layer 228. The drilled vias may be filled with conductive material to interconnect traces of newly formed conductive layers with the existing conductive layers formed in step S310.

In general, for m top buildup layers and n bottom buildup layers (where m>n), steps S312, S314 and S316 may be used to form n pairs of buildup layers, each pair having one of the n buildup layers to be formed on the second (bottom) surface of the core, and one of the remaining n of the m buildup layers formed on the first (top) surface. Each buildup layer includes a dielectric layer and a conductive layer formed thereon. Forming each of the n pairs of buildup layers involves drilling each one of a respective pair of dielectric layers, and desmearing that pair of dielectric layers concurrently (S314). Conductive layers are then formed on the desmeared dielectric layers (S316). As may be appreciated, (m−n) of the m layers have already been formed using steps S306, S308, S310.

In step S318, solder mask is applied to circuits formed on buildup layers 224, 228. Solder masks are of course applied on the outermost buildup layers 224, 228. As will be discussed below, solder mask 232 applied on the side having fewer buildup layers (e.g., lower side) may be substantially thicker than solder mask 220 on the opposite (upper) side of core 218.

In step S320, surface finishing is performed to prepare the surface for mounting solder balls and/or attaching a die.

Advantageously, only one desmearing step is applied to each layer of dielectric material (e.g. ABF) in the exemplary process depicted in S300. Accordingly, the substrate in FIG. 4K would not have any overdesmeared buildup layers that typically result from undergoing two or more desmearing steps.

It is may easily observed, that the method depicted in S300 is representative of a generalized method of manufacturing a substrate that is exemplary of an embodiment of the present invention. Accordingly, a general method of manufacturing a substrate having a core (e.g. core 218), m buildup layers (e.g., two buildup layers 226, 224) on a first (e.g. top) surface of the core and n buildup layers (e.g. one buildup layer 228) on a second (e.g., bottom) surface of the core (where m>n) involves: forming (m−n) of the m buildup layers on the first surface, where forming each of the (m−n) of the m buildup layers includes drilling and desmearing a respective dielectric layer; and forming n pairs of buildup layers, each of the n pairs including one of the n buildup layers formed on the second surface and one of the remaining n of the m buildup layers formed on the first surface. Forming each of the n pairs of buildup layers includes drilling each one of a respective pair of dielectric layers, and desmearing the respective pair of dielectric layers concurrently. Each buildup layer may be formed by sequentially forming a dielectric layer, drilling and desmearing the dielectric, and forming a conductive layer of traces on the desmeared dielectric. Conductive traces my be formed by etching or depositing conductive materials, such as thin-film metal or copper foil, after the dielectric layer is drilled and desmeared. FIGS. 4A-4K, depict a particular example for m=2, n=1 and (m−n)=1, so that the (m−n) layers are represented by buildup layer 226, and the n pairs of buildup layers includes a pair of buildup layers 224, 228.

In alternate embodiments, laser drilling and machine drilling may be interchangeably used for drilling core layers having a thickness or height less than about 100 μm. Thicker cores (e.g., 400 μm or 800 μm) typically use mechanical drilling. Of course other known methods for forming holes or cavities within dielectric materials or insulators may also be used.

Moreover, not all steps may be required, or additional steps may be added. For example, a many more buildup layers may be formed in addition those shown. As will be detailed below, copper rings may also be embedded to strengthen the substrate and mitigate warping.

As should now be apparent, conventional manufacturing methods such that depicted in flowchart S100 could lead to overdesmeared buildup layers. As noted above, overdesmearing leads to undesirable changes in the adhesion properties a dielectric layer. Moreover laser drilled vias may become larger, and dielectric surfaces may become rougher, due to overdesmearing—as a result of multiple desmearing operations that are applied to a particular buildup layer. These disadvantages are conveniently avoided by the use of the exemplary manufacturing process depicted in flowchart S300.

Coreless substrates and single-sided substrates are also highly susceptible to warping. Stiffeners are often required to ensure that coreless or single-sided substrates can withstand mechanical and thermal stresses that cause warping and potentially render circuits inoperable.

Exemplary embodiments of the present invention may include thicker buildup dielectric layers and thicker soldermask layers on the side of the core that contains fewer buildup layers, to mitigate warping. Thus in step S312, bottom buildup layer 228 may use a thicker dielectric layer than the dielectric layer used in buildup layers 224, 226. In one exemplary embodiment, buildup layer 228 may be about 40 μm-60 μm, while buildup layers 224, 226 are each about 25 μm-40 μm.

Similarly, in step S318 the bottom solder mask 232 may be made substantially thicker than its corresponding upper solder mask 220. Depending on the size of a circuit package, various relative thickness values may be used. In one exemplary embodiment, solder mask 232 may be 30 µm-60 µm while solder mask 220 may only be 16 µm-30 µm in height.

Solder mask 232 may be replaced by a layer of dielectric material. In addition, as will be described below, a plurality of rings, made for example of copper, may be used to reinforce the semiconductor devices exemplary of the present invention.

Accordingly FIG. 5 depicts a partial vertical cross-section of an exemplary integrated circuit package 200 including a substrate 204 having buildup layers on both sides. Integrated circuit package 200 includes a die 202 attached to substrate 204.

Die 202 is typically made of a semiconductor material such as a piece of silicon wafer and contains an integrated circuit and pads 208 formed on its active surface. Pads 208 provide I/O connection points to the integrated circuit on die 202. UBM may be formed on each of pads 208 to facilitate attachment of solder bumps 210 using the controlled collapse chip connect (C4) or flip chip attachment technique. Solder bumps 210 formed on pads 208 may be used to attach die 202 to substrate 204.

Substrate 204 includes a substrate core 218, and a plurality of buildup layers 224, 226, 228. Solder masks 220, 232 are formed on the outermost buildup layers 224, 228 respectively. Pre-solder 236 may be applied on each of substrate pads 234.

Substrate core 218 may include a plurality of its own multiple layers or sub-layers (not shown). A plated through hole (PTH) 216 formed in core 218 can be used to electrically interconnect traces 212 in layers 224, 226 with traces 212 in layer 228. Vias or micro-vias 214 may be formed by laser drilling, and plated or filled with conductive material to interconnect traces on layer 224 with those on layer 226. Similarly micro-vias 214 may be used to interconnect traces 212 on layer 226 with traces on the upper surface of core 218; or traces on layer 228 with traces on the lower surface of core 218.

Pre-solder 236 may be in the form of solder paste, and thus may increase solder volume and provide good interconnection between solder bumps 210 and substrate pads 234 during the die attach process. Pre-solder 236 also increases the effective height of bumps 210 which helps capillary underfill processes.

In contrast to the substrate depicted in FIG. 2K, in package 200 buildup layer 228 may contain a much thicker dielectric material than layers 224, 226. As noted above, layer 228 may be 40 µm-60 µm thick while layers 224, 226 may each have a nominal thickness in the range of 25 µm-40 µm exclusive. In some embodiments, any layer (e.g., buildup layer 228) on the side of the core containing fewer buildup layers (e.g., bottom) may be thicker than each layer (e.g., layers 224, 226) on the opposite (e.g., top) side. Similarly, solder mask 232 may be much thicker than solder mask 220. In one embodiment, solder mask 220 may have a height of 16 µm-30 µm exclusive while solder mask 232 may have a thickness in the range of 30 µm-60 µm. The specific heights of buildup layers and solder masks are provided only as examples, to highlight the relative thicknesses of buildup layers. Other embodiments may of course use thickness values outside the ranges specified. Advantageously, thicker layers and solder masks help mitigate warping in package 200.

Figure 6:
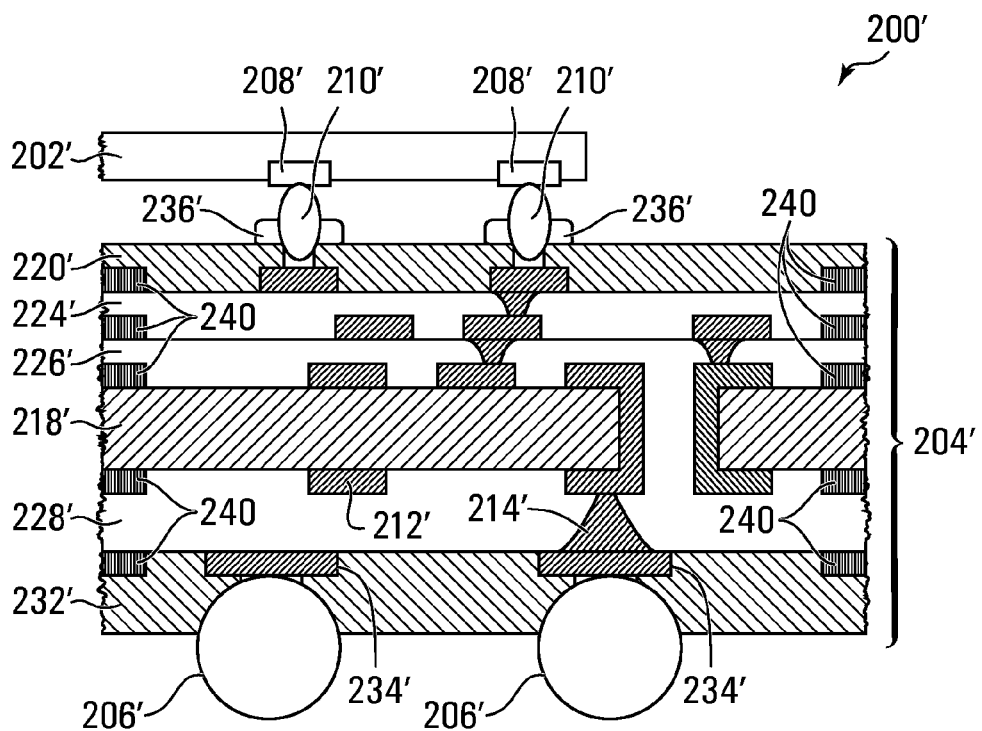
FIG. 6 is a vertical cross-sectional view of another embodiment of an exemplary semiconductor device having an unequal number of buildup layers on each side of its core and copper rings.

Additional reinforcements may be provided to prevent warping. Accordingly, FIG. 6 depicts a cross-sectional view of an integrated circuit package 200' exemplary of another embodiment of the present invention. Package 200' may be substantially similar to package 200, except for the presence of a plurality of rings 240 provided to help reduce warping. Like parts in FIG. 5 and FIG. 6 are substantially similar in structure and function, and are labeled with like numerals. A prime (') symbol distinguishes parts in FIG. 6 from its counterparts in FIG. 5, and will not be discussed further.

In addition, core 218 or core 218' may be formed from a material having a low coefficient of thermal expansion (CTE), which helps mitigate warping. Materials may have linear coefficients of thermal expansion (denoted $\alpha_1$, $\alpha_2$) in perpendicular in-plane directions. Exemplary materials may include those with coefficients of thermal expansion less than about 15 ppm/° C. (e.g., $\alpha_1$, $\alpha_2$ 5-12 ppm/° C.), glass-cloth reinforced resins having high glass transition temperature (Tg) of about 200° C.-240° C., and the like.

Rings 240 may be formed by depositing metal (e.g., copper) of suitable thickness on one or more of buildup layers 224', 226', 228' or core 218', as part of (or after) forming a respective conductive layer. Various ways of embedding stiffener rings within semiconductor packages are well known to those of ordinary skill in the art, and may be used to form rings 240. In one embodiment, rings 240 may be formed together with conductive traces 212 during circuit formation stage.

Rings 240 may take on the shape of the package 200'. That is, a plan view of rings 240 may be substantially the same as an outline of the circumference of package 200' as viewed from above.

Rings 240 may be made of similar material as the traces themselves, (e.g., copper). Conveniently, this allows rings 240 to be formed at the same manufacturing step used to form conductive traces on a buildup layer. In alternate embodiments, other materials of suitable strength may also be used to construct rings 240.

The use of thicker dielectric and solder mask layers on the side of the core containing fewer buildup layers, restores balance to package 200' in spite of having an asymmetric (unequal number of) buildup layers on opposite sides (i.e., top and bottom) core 218'.

Conveniently, making package 200' using an exemplary method such as the process depicted in flowchart S300 successfully avoids over-desmearing of its buildup layers (e.g., layer 228'), while at the same time rings 240, thicker dielectric layer 228' and thicker solder mask 232' help mitigating warping.

As may be appreciated, embodiments of the present invention may include exemplary substrates having many different combinations of buildup layers on either side of the core. The substrates with asymmetric buildup layers discussed above are only exemplary and not limiting. Other embodiments of the present invention may generally have buildup designs of the form m/k/n where m and n, are positive integers and m≠n (e.g., m>n>0). The core may have any number of layers, and typically two (i.e., k=2) and sometimes four layers (i.e., k=4) may be present within the core, which leads to a 2/2/1 and a 2/4/1 substrate, respectively.

Semiconductor device manufacturing using exemplary methods discussed above may be performed for each die, or at the wafer level. In wafer level packaging, instead of applying the methods discussed to a substrate for an individual die, the packaging methods are applied to a substrate for an entire fabricated wafer at once. As a last step, the substrate and wafer are cut into individually packaged semiconductor packages ready for assembly onto an external wiring board.

In the forgoing discussions, the terms 'top' and 'bottom' (or 'upper' and 'lower') used to refer to opposite surfaces or sides of the core correspond with the illustrations of exemplary embodiments, and may thus be interchanged, depending on the orientation of the figures.

Embodiments of the present invention may be used in a variety of applications including the manufacture of DRAM, SRAM, EEPROM, flash memory, graphics processors, general purpose processors, DSPs, and various standard analog, digital and mixed signal circuit packages.

Exemplary methods and substrates may be applied to constructing printed circuit boards (PCB) or printed wiring boards (PWB) as well as carrier substrates for integrated circuit packages. Embodiments of the invention may thus be used in motherboards, daughter cards, memory modules, peripheral expansion cards (e.g., graphics cards, network interface cards, sound cards), and the like.

Of course, the above described embodiments are intended to be illustrative only and in no way limiting. The described embodiments of carrying out the invention are susceptible to many modifications of form, arrangement of parts, details and order of operation. The invention, rather, is intended to encompass all such modification within its scope, as defined by the claims.

What is claimed is:

1. A method of manufacturing a substrate having a core, m buildup layers on a first surface of said core and n buildup layers on a second surface of said core, wherein each of said buildup layers comprises a dielectric layer, and a conductive layer thereon, and where m>n, said method comprising:
    forming (m−n) of said m buildup layers on said first surface, wherein forming each of said (m−n) of said m buildup layers comprises drilling and desmearing a respective dielectric layer; and
    after said forming (m−n) buildup layers, additionally forming n pairs of buildup layers, each of said n pairs comprising one of said n buildup layers formed on said second surface and one of the remaining n of said m buildup layers formed on said (m−n) buildup layers on said first surface, and wherein said forming each of said n pairs of buildup layers comprises drilling each one of a respective pair of dielectric layers, and desmearing said respective pair of dielectric layers concurrently.

2. The method of claim 1, wherein said drilling each one of a respective pair of dielectric layers, comprises laser drilling.

3. The method of claim 1, wherein any dielectric layer in any one of said m buildup layers and said n buildup layers, is desmeared only once.

4. The method of claim 1, wherein said desmearing said respective pair of dielectric layers comprises removing residue from said respective pair of dielectric layers after said drilling each one of a respective pair of dielectric layers.

5. The method of claim 1, further comprising forming a plurality of conductive traces on at least one of said first and second surfaces of said core prior to said forming (m−n) of said m buildup layers, and electrically connecting said plurality conductive traces on said first and second surfaces of said core.

6. The method of claim 5, said electrically interconnecting comprises drilling at least one hole in said core and plating said hole with conductive material to form a plated through-hole (PTH).

7. The method of claim 6, wherein said drilling said at least one hole in said core comprises machine drilling.

8. The method of claim 1, wherein each of said n buildup layers comprises a dielectric layer having a height in the range of 40 µm to 60 µm and each of said m buildup layers comprises a dielectric layer having a height in the range 25 µm to 40 µm exclusive.

9. The method of claim 1, further comprising: forming a first solder mask on an outermost one of said m buildup layers.

10. The method of claim 8, further comprising forming a second solder mask an outermost one of said n buildup layers.

11. The method of claim 10, wherein said first solder mask has a height in the range 16 µm to 30 µm exclusive and said second solder mask has a height in the range 30 µm-60 µm.

12. The method of claim 1, further comprising, forming rings in at least some of said n buildup layers on said second surface of said core, to reinforce said substrate.

13. The method of claim 12, wherein said rings are copper rings.

14. The method of claim 1, wherein m=2 and n=1.

* * * * *